United States Patent [19]

Schittenhelm et al.

[11] Patent Number: 4,689,271

[45] Date of Patent: Aug. 25, 1987

[54] COATING FOR METALLIC SUBSTRATES

[75] Inventors: Hans-Joachim Schittenhelm, Leverkusen; Werner Joseph, Cologne; Otto Krist, Overath, all of Fed. Rep. of Germany

[73] Assignee: Bayer Aktiengesellschaft, Leverkusen, Fed. Rep. of Germany

[21] Appl. No.: 759,015

[22] Filed: Jul. 25, 1985

[30] Foreign Application Priority Data

Aug. 11, 1984 [DE] Fed. Rep. of Germany ....... 3429666
Dec. 20, 1984 [DE] Fed. Rep. of Germany ....... 3446554

[51] Int. Cl.$^4$ .............................................. B32B 9/04
[52] U.S. Cl. ..................................... 428/446; 428/450; 428/454; 428/469; 428/471; 428/472; 428/697; 428/702
[58] Field of Search ............... 428/446, 450, 454, 469, 428/471, 472, 697, 702

[56] References Cited

U.S. PATENT DOCUMENTS 3,598,620  8/1971  Akhtar ................................. 428/454
4,214,026  7/1980  Ibata et al. ............................ 428/75

Primary Examiner—George F. Lesmes
Assistant Examiner—P. R. Schwartz
Attorney, Agent, or Firm—Sprung Horn Kramer & Woods

[57] ABSTRACT

The present invention relates to metal substrates which are coated with electrically insulating layers whose electrical resistance has a low temperature dependence, the insulating layer on said metal substrates consisting essentially of a melted-on material containing 43–47% by weight of $B_2O_3$, 29–33% by weight of CaO, 10–15% by weight of $SiO_2$, 7–10% by weight of $Al_2O_3$ and 1–2% by weight of MgO.

5 Claims, 1 Drawing Figure

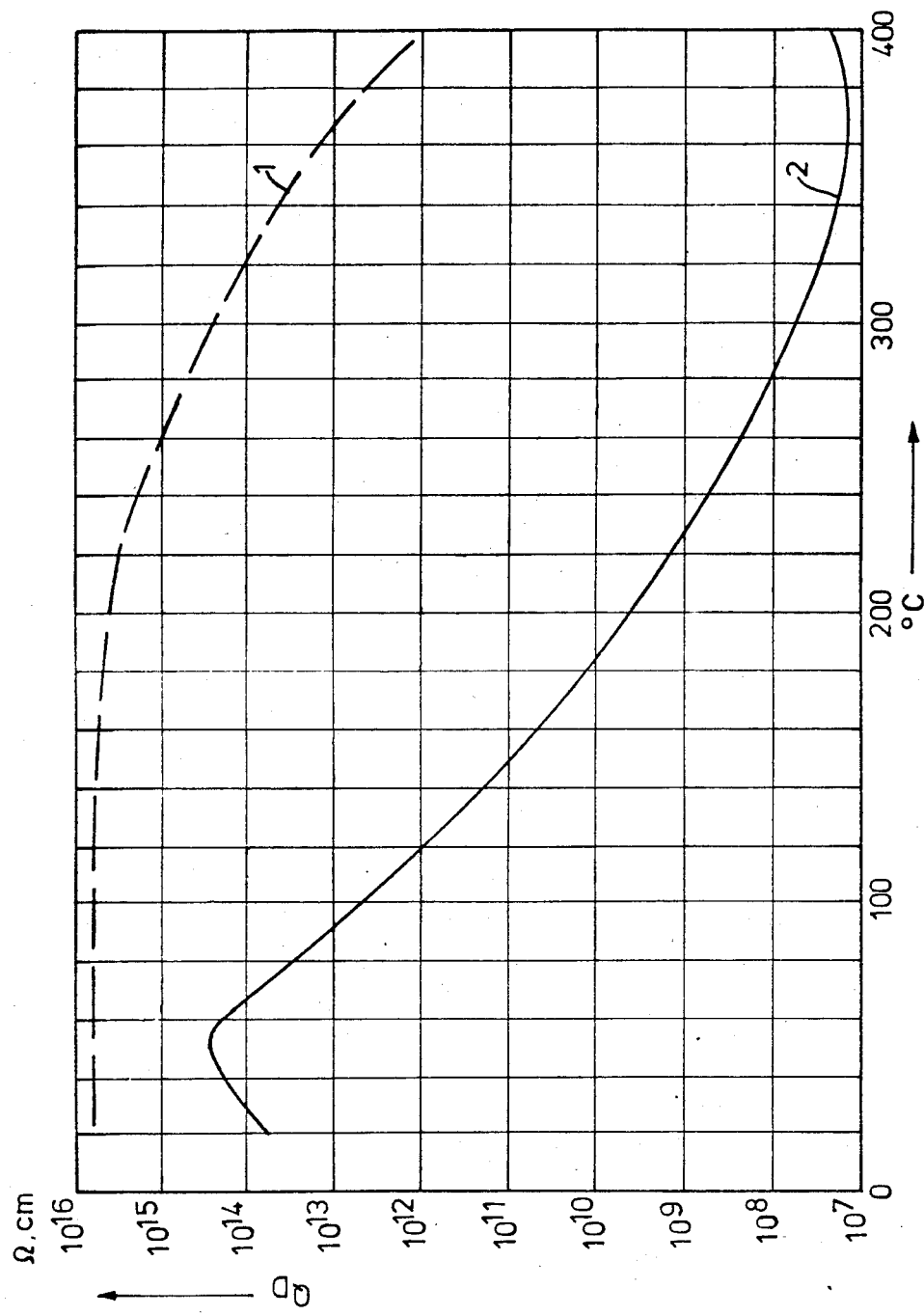

COATING FOR METALLIC SUBSTRATES

The present invention relates to electrically insulating coatings for metallic substrates, which particularly serve in the case of printed strip conductors and strip resistors, as base material in the electrical and electronics industry.

Steel substrates coated with silicate are superior as printed-circuit boards for printed circuits, to those consisting of organic polymers, aluminum oxide or sintered ceramic, owing to their thermal stability, mechanical stability and thermal conductivity. Furthermore, the widesurface formats have economic advantages. Such coated steel substrates are known, for example, from Chemie-Anlagen und Verfahren CAV 1981, Sept. P. 60; Markt und Technick, Wochenzeitung für Elektronik 24, 1979; Proceedings of the Porcelain Enamel Institute, Vol. 42 (1980), P. 160–165.

Sufficient adhesion, smooth even surfaces, good covering of the edges, as well as particular dielectric properties, such as high electrical resistance and breakdown voltage, are required for the use of silicate layers on metallic carriers.

In practice, borosilicate glasses with a low alkaline content have been proved reliable. These are applied analogously to enamel frits, to the treated steel substrate in slip form or as powder and are dissolved by heat at a temperature of from 800° to 850° C. (c.f. e.g. DE-PS No. 2,015,072).

It was also proposed to apply barium borate as an electrically insulating layer. This has the disadvantage, however, that no smooth surfaces are thereby obtained (c.f. e.g. U.S. Pat. No. 4,355,115).

The electrical resistance of borosilicate glasses decreases, as known, as the temperature increases. The specific volume resistivity of a layer applied to a metal substrate in usual manner, already falls with a temperature increase of 200° C., by several orders of magnitude. Recently, electrically insulating coatings of metallic working parts have been desired, the resistance of which is maintained even at relatively high temperatures. It was therefore an object of the present invention to provide coatings for metallic substrates, which coatings meet these demands.

Thus an object of the present invention are metal substrates provided with electrically insulating layers, the temperature dependency of the resistance being relatively low, which metal substrates are characterized in that the insulating layer substantially consists of a fusible material, which contains about 43–47% (by weight) $B_2O_3$: 29–33% CaO; 10–15% $SiO_2$; 7–10% $Al_2O_3$ and 1–2% MgO.

The coating is applied in a known manner in the form of a slip or a powder. This can take place, for example, according to a process a described in DE-PS No. 2,015,972. The stoving temperature should thereby be from 800° C. to 850° C.

Corresponding molten mixtures, for example of boric acid, $CaCO_3$, magnesium carbonate, quartz and alkaline free clay materials are suitable as coating material. Preferably, a mixture of colemanite and clay is used.

Degreased, steeped steel sheets with a nickel layer of from about 0.5 to 1.5 $g/m^3$ are preferably used in a usual manner as substrates.

It was surprisingly found that such material dissolved by heat on sheet steel has only a very low temperature dependency on the specific volume resistivity.

The volume resistivity of the substrates coated in this manner, can be determined easily, as a function of the temperature according to DIN 53 482/VDE 0303/Part 3, IEC-Publ. 93.

Measuring takes place continuously on 10×10 cm test samples. Sticking electrodes with a measuring surface of 16 $cm^2$ were used for measuring with an applied voltage of a hundred volts.

The difference between the calcium borate coating, according to the invention, in contrast to borosilicate glasses, low in alkali, as used nowadays for coating steel printed-circuit boards, is shown in the attached drawing, in which the dependency of the specific volume resistivity on the temperature is shown.

Curve 1 shows a coated substrate according to the invention. The material consisted of 47% (by weight) $B_2O_3$; 32.4% CaO; 11.6% $SiO_2$; 7.3% $Al_2O_3$ and 1.7% MgO.

Curve 2 gives the values for a material which consisted of 14% $B_2O_3$; 26% BaO; 39.8% $SiO_2$; 3.4% $Al_2O_3$; 3.0% $ZrO_2$; 3.0% NiO; 1.0% CoO; 4.6% $CaF_2$ and 5.2% $Li_2O$.

Steel substrates coated in such a manner serve, for example, as carriers for heating elements. Upon these elements metallic heating elements are applied or are printed with strip resistors, for example in paste form, which develop heat during the flow of current. They are used for warming plates, hot-water heaters or as surface heating elements for central heating. In these cases, it is necessary that the insulating properties of the coating according to the invention are extensively maintained, even at a relatively high temperature.

These heating elements can be coated in the usual manner by a second layer of colored or decorative enamel coating in order to obtain an aesthetic effect.

A further use of the coated metal substrates according to the invention is the application of electric strip conductors in place of the previously usual wiring with electric cables, for example in household and kitchen appliances, for electric switching processes and control processes.

The object of the present invention will now be explained in more detail by means of the following example (%-data are % by weight).

A mixture of 250.2 g of boric acid, 176.7 g of calcium carbonate, 12.0 g of magnesium carbonate, 5.1 g of quartz and 57.9 g of clay composed of $SiO_2$ (48%) and $Al_2O_3$ (38%) was melted in a fireclay crucible, which was lined with quartz sintered at 1500° C. and had already been sealed by several melts, in an electrically heated furnace for between 20 and 30 mins. at 1200° C. The transparent melt obtained in this manner was quenched between steel rollers. Then the flakes obtained in this manner were ground in a porcelain ball mill with the addition of 0.04% methyl hydrogen silicone oil until 80% of the resulting powder had a particle size of (40 $\mu$m. A free-flowing powder with a surface resistance of $10^{16}$ ohms was thus obtained.

This powder is applied to a degreased, scoured, and nickel-plated steel sheet, of a thickness of 1 mm, by a method which is the subject of German Patent Specification No. 2,015,072, with the aid of a pistol of the type used for electrostatic powder coating, with the application of a voltage of 70,000 volts to the corona electrode and with the aid of propelling air. The powder was applied in an amount of 5.5 $g/dm^2$ so that a smooth coating of a thickness of about 200 $\mu$m is formed on the steel sheet after stoving for 4 minutes at 800° C.

The coating material according to the invention can even be obtained by melting a simple mixture of two minerals such as colemanite and clay. If colemanite composed of 42% of $B_2O_3$, 29% of CaO, 2% of $SiO_2$, 1.5% of MgO and 25.5% of $H_2O$ and clay contained 48% of $SiO_2$ and 38% of $Al_2O_3$ are used, 335.7 g of colemanite and 57.9 g of clay provide a material which is equivalent to that mentioned in the above example.

It will be understood that the specification and drawing are illustrative but not limitative of the present invention and that other embodiments within the spirit and scope of the invention will suggest themselves to those skilled in the art.

What is claimed is:

1. A metal sheet carrying an electrically insulating layer with a relatively low temperature dependency of the electrical resistance, the insulating layer consisting essentially by weight of about 43–47% $B_2O_3$, 29–33% CaO, 10–15% $SiO_2$, 7–10% $Al_2O_3$ and 1–2% MgO, the layer having been produced by fusing a mixture of the necessary oxides, quenching, reducing the quenched material to a powder and applying the powder to the sheet in the form of a powder or an aqueous slip, wherein said sheet is a steel sheet.

2. A coated material sheet according to claim 1, wherein the coating is obtained from a mixture of colemanite and clay material.

3. An electric printed-circuit board, printed circuit or heating element including a coated metal sheet according to claim 1.

4. A coated metal substrate according to claim 1, wherein the metal substrate is a steeped steel with a nickel layer.

5. A coated metal substrate according to claim 4, wherein the nickel layer is 0.5 to 1.5 $g/m^3$.

* * * * *